(12) United States Patent
Lee et al.

(10) Patent No.: US 12,494,445 B2
(45) Date of Patent: Dec. 9, 2025

(54) RADIOFREQUENCY FILTER AND MANUFACTURING METHOD THEREOF

(71) Applicant: UNITED MICROELECTRONICS CORP., Hsin-Chu (TW)

(72) Inventors: Chien-Yi Lee, Hsinchu (TW);
Sheng-Huei Dai, Taitung County (TW);
Chen-Wei Pan, Hsinchu County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 425 days.

(21) Appl. No.: 18/094,397

(22) Filed: Jan. 9, 2023

(65) Prior Publication Data

US 2024/0186271 A1   Jun. 6, 2024

(30) Foreign Application Priority Data

Dec. 5, 2022   (TW) .................................. 111146560

(51) Int. Cl.
*H01L 23/66*   (2006.01)
*H01Q 15/24*   (2006.01)

(52) U.S. Cl.
CPC ............ *H01L 23/66* (2013.01); *H01Q 15/24* (2013.01); *H01L 2223/6605* (2013.01); *H01L 2223/6688* (2013.01)

(58) Field of Classification Search
CPC . H01L 23/58; H01L 23/66; H01L 2223/6605; H01L 2223/6688; H10P 1/20; H10P 1/2039; H10Q 15/24; H10D 1/20; H10D 30/01; H10D 30/60; H10D 62/113; H10D 99/00

See application file for complete search history.

(56) References Cited

U.S. PATENT DOCUMENTS 9,905,633 B1 *   2/2018   Yang ................. H01L 21/76816
2020/0006228 A1 *   1/2020   Yang .................... H10D 84/038

* cited by examiner

*Primary Examiner* — Cheung Lee
(74) *Attorney, Agent, or Firm* — Winston Hsu

(57) ABSTRACT

A radiofrequency filter includes a substrate, an isolation structure, an electrically conductive structure, a spacer structure, a dielectric layer, a patterned electrically conductive film, a first contact structure, and a second contact structure. The isolation structure is disposed in the substrate. The electrically conductive structure is disposed on the isolation structure. The spacer structure is disposed on the substrate and located on a sidewall of the electrically conductive structure. The dielectric layer is disposed on the electrically conductive structure. The patterned electrically conductive film is disposed on the dielectric layer. At least a part of the dielectric layer is located between the electrically conductive structure and the patterned electrically conductive film in a vertical direction. The first contact structure and the second contact structure are disposed on and electrically connected with the patterned electrically conductive film.

18 Claims, 8 Drawing Sheets

RADIOFREQUENCY FILTER AND MANUFACTURING METHOD THEREOF

BACKGROUND OF THE INVENTION

1. Field of the Invention

The present invention relates to a circuit structure and a manufacturing method thereof, and more particularly, to a radiofrequency filter and a manufacturing method thereof.

2. Description of the Prior Art

The micro-processor system comprised of integrated circuits (IC) is a ubiquitous device, being utilized in such diverse fields as automatic control electronics, mobile communication devices and personal computers. With the development of technology and the increasingly imaginative applications of electrical products, the IC device is becoming smaller, more delicate and more diversified.

In the modern society, current semiconductor devices often include radiofrequency (RF) circuit structures to perform wireless communication capabilities. In the RF device, a RF signal filter is generally set to filter signals with a specific frequency, so as to improve signal interference between signals within different frequency bands and signals from different communication systems. However, the general RF signal filter needs to have an inductor occupying a large area to achieve the effect of signal filtering, which creates relatively large restrictions on the layout design of related circuits and/or devices.

SUMMARY OF THE INVENTION

A radiofrequency filter and a manufacturing method thereof are provided in the present invention. A dielectric layer is disposed between an electrically conductive structure and a patterned electrically conductive film, and a first contact structure and a second contact structure are disposed on the patterned electrically conductive film for forming a low electrical resistance (or low electrical impedance) path and a high electrical resistance (or high electrical impedance) path so as to realize signal filtering.

According to an embodiment of the present invention, a radiofrequency filter is provided. The radiofrequency filter includes a substrate, an isolation structure, an electrically conductive structure, a spacer structure, a dielectric layer, a patterned electrically conductive film, a first contact structure, and a second contact structure. The isolation structure is disposed in the substrate, the electrically conductive structure is disposed on the isolation structure, and the spacer structure is disposed on the substrate and located on a sidewall of the electrically conductive structure. The dielectric layer is disposed on the electrically conductive structure, the patterned electrically conductive film is disposed on the dielectric layer, and at least a part of the dielectric layer is located between the electrically conductive structure and the patterned electrically conductive film in a vertical direction. The first contact structure and the second contact structure are disposed on and electrically connected with the patterned electrically conductive film.

According to an embodiment of the present invention, a manufacturing method of a radiofrequency filter is provided. The manufacturing method of the radiofrequency filter includes the following steps. An isolation structure is formed in a substrate. A spacer structure is formed on the substrate. An electrically conductive structure is formed on the isolation structure, and the spacer structure is located on a sidewall of the electrically conductive structure. A dielectric layer is formed on the electrically conductive structure, and a patterned electrically conductive film is formed on the dielectric layer. At least a part of the dielectric layer is located between the electrically conductive structure and the patterned electrically conductive film in a vertical direction. A first contact structure and a second contact structure are formed on the patterned electrically conductive film. The first contact structure and the second contact structure are electrically connected with the patterned electrically conductive film.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 4-7 are schematic drawings illustrating a manufacturing method of a radiofrequency filter according to the first embodiment of the present invention, wherein FIG. 5 is a schematic drawing in a step subsequent to FIG. 4, FIG. 6 is a schematic drawing in a step subsequent to FIG. 5, and FIG. 7 is a schematic drawing in a step subsequent to FIG. 6.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The ordinal numbers, such as "first", "second", etc., used in the description and the claims are used to modify the elements in the claims and do not themselves imply and represent that the claim has any previous ordinal number, do not represent the sequence of some claimed element and another claimed element, and do not represent the sequence of the manufacturing methods, unless an addition description is accompanied. The use of these ordinal numbers is only used to make a claimed element with a certain name clear from another claimed element with the same name.

The term "etch" is used herein to describe the process of patterning a material layer so that at least a portion of the material layer after etching is retained. When "etching" a material layer, at least a portion of the material layer is retained after the end of the treatment. In contrast, when the material layer is "removed", substantially all the material layer is removed in the process. However, in some embodiments, "removal" is considered to be a broad term and may include etching.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
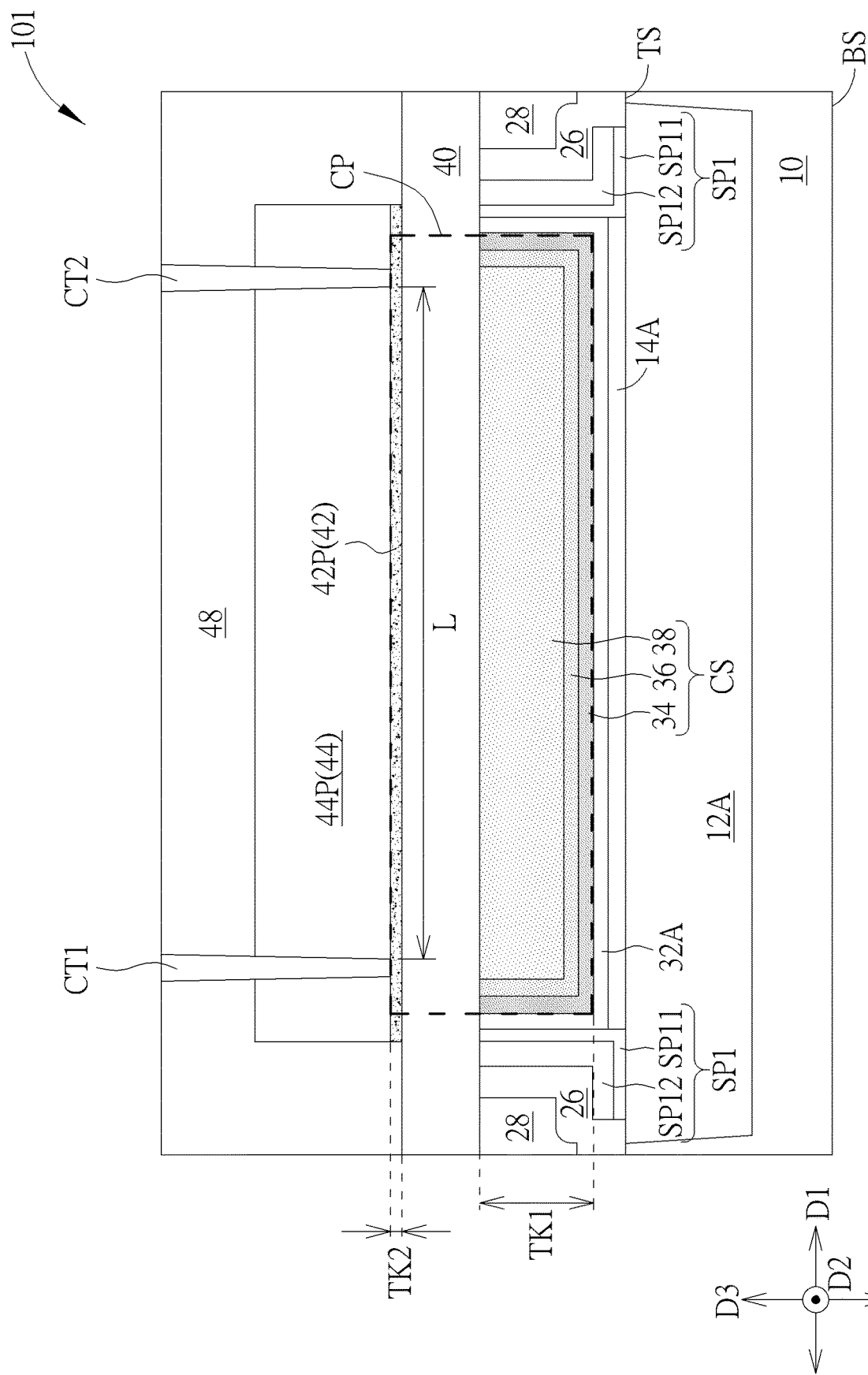
FIG. 1 is a schematic drawing illustrating a radiofrequency filter according to a first embodiment of the present invention.
Figure 2:
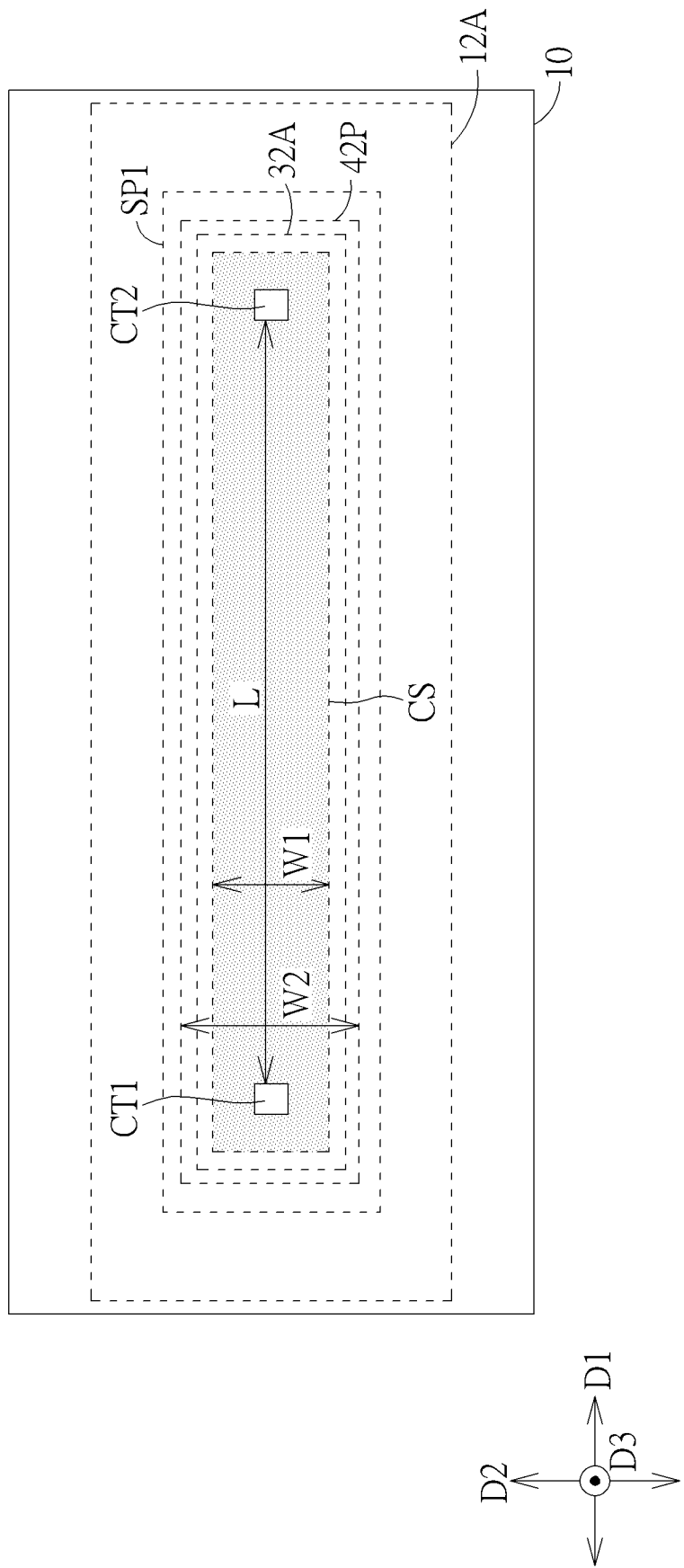
FIG. 2 is a top view schematic drawing illustrating the radiofrequency filter according to the first embodiment of the present invention.

Please refer to FIG. 1 and FIG. 2. FIG. 1 is a schematic drawing illustrating a radiofrequency (RF) filter 101 according to a first embodiment of the present invention, and FIG. 2 is a top view schematic drawing illustrating the radiofrequency filter in this embodiment. As shown in FIG. 1, the radiofrequency filter 101 includes a substrate 10, an isolation structure 12A, an electrically conductive structure CS, a spacer structure SP1, a dielectric layer 40, a patterned electrically conductive film 42P, a first contact structure CT1, and a second contact structure CT2. The isolation structure 12A is disposed in the substrate 10, the electrically conductive structure CS is disposed on the isolation structure 12A, and the spacer structure SP1 is disposed on the substrate 10 and located on a sidewall of the electrically conductive structure CS. The dielectric layer 40 is disposed on the electrically conductive structure CS, the patterned electrically conductive film 42P is disposed on the dielectric layer 40, and at least a part of the dielectric layer 40 is located between the electrically conductive structure CS and the patterned electrically conductive film 42P in a vertical direction D3. The first contact structure CT1 and the second contact structure CT2 are disposed on and electrically connected with the patterned electrically conductive film 42P. By the structural design described above, a low electrical resistance (or low electrical impedance) path and a high electrical resistance (or high electrical impedance) path may be formed on the radiofrequency filter 101 for realizing the effect of signal filtering.

In some embodiments, the vertical direction D3 described above may be regarded as a thickness direction of the substrate 10. The substrate 10 may have a top surface TS and a bottom surface BS opposite to the top surface TS in the vertical direction D3, and the electrically conductive structure CS, the spacer structure SP1, the dielectric layer 40, the patterned electrically conductive film 42P, the first contact structure CT1, and the second contact structure CT2 described above may be disposed at the side of the top surface TS of the substrate 10. Horizontal directions substantially orthogonal to the vertical direction D3 (such as a first horizontal direction D1 and a second horizontal direction D2 illustrated in FIG. 1 and other directions orthogonal to the vertical direction D3) may be substantially parallel with the top surface TS and/or the bottom surface BS of the substrate 10, but not limited thereto. In this description, a distance between the bottom surface BS of the substrate 10 and a relatively higher location and/or a relatively higher part in the vertical direction D3 may be greater than a distance between the bottom surface BS of the substrate 10 and a relatively lower location and/or a relatively lower part in the vertical direction D3. The bottom or a lower portion of each component may be closer to the bottom surface BS of the substrate 10 in the vertical direction D3 than the top or upper portion of this component. Another component disposed above a specific component may be regarded as being relatively far from the bottom surface BS of the substrate 10 in the vertical direction D3, and another component disposed under a specific component may be regarded as being relatively close to the bottom surface BS of the substrate 10 in the vertical direction D3.

In some embodiments, at least a part of the dielectric layer 40 may be sandwiched between the patterned electrically conductive film 42P and the electrically conductive structure CS in the vertical direction D3, and the dielectric layer 40 may be directly connected with the patterned electrically conductive film 42P and the electrically conductive structure CS. The patterned electrically conductive film 42P, the electrically conductive structure CS, and the dielectric layer 40 sandwiched between the patterned electrically conductive film 42P and the electrically conductive structure CS in the vertical direction D3 may constitute a capacitor structure CP, but not limited thereto. In some embodiments, other electrically conductive layers and/or dielectric layers may be disposed between the patterned electrically conductive film 42P and the dielectric layer 40 and/or between the dielectric layer 40 and the electrically conductive structure CS according to some design considerations for forming a multiple layer capacitor structure. In some embodiments, the patterned electrically conductive film 42P may include metallic electrically conductive materials (such as titanium nitride or other suitable metallic electrically conductive materials), the dielectric layer 40 may include oxide insulation material, nitrogen doped carbide (NDC) or other suitable insulation materials, and the electrically conductive structure CS may include metallic electrically conductive materials (such as tungsten, titanium nitride, tantalum nitride, and so forth). Therefore, the capacitor structure CP may be regarded as a metal-insulator-metal (MIM) capacitor structure.

In some embodiments, the electrically conductive structure CS and a metal gate structure of a transistor structure (not illustrated in FIG. 1) disposed on another region of the substrate 10 may be formed concurrently by the same manufacturing process, and a material composition of the electrically conductive structure CS may be similar to or identical to a material composition of the metal gate structure accordingly. For example, in some embodiments, the electrically conductive structure CS may include a barrier layer 34, a work function layer 36, and a metallic electrically conductive layer 38. The work function layer 36 may be disposed on the barrier layer 34, and the metallic electrically conductive layer 38 may be disposed on the work function layer 36. The materials of the barrier layer 34 and the work function layer 36 may include titanium nitride, tantalum nitride, titanium carbide, tantalum carbide, tungsten carbide, titanium aluminide, titanium aluminum nitride, or other suitable electrically conductive materials, and the metallic electrically conductive layer 38 may include low electrical resistivity materials, such as tungsten, aluminum, copper, titanium aluminide, titanium, or other materials with low electrical resistivity. It is worth noting that, the electrically conductive structure CS in this invention is not limited to the structure illustrated in FIG. 1, and other electrically conductive materials and/or a multi-layer structure formed with other electrically conductive materials stacked with one another may be used as the electrically conductive structure CS according to some design considerations. In addition, because the electrically conductive structure CS and the metal gate structure may be formed by the same manufacturing process, the radiofrequency filter 101 may further include a gate dielectric layer 14A and a high dielectric constant (high-k) dielectric layer 32A disposed between the electrically conductive structure CS and the isolation structure 12A accordingly. The gate dielectric layer 14A may include an oxide dielectric material (such as silicon oxide) or other suitable dielectric materials, and the high-k dielectric layer 32A may include hafnium oxide, aluminum oxide, tantalum oxide, zirconium oxide, hafnium silicon oxide, hafnium silicon oxynitride, or other suitable high-k dielectric materials, such as a high-k dielectric material having a dielectric constant higher than that of silicon oxide, nit not limited thereto. In some embodiments, the high-k dielectric layer 32A may have a U-shaped structure in a cross-sectional view of the radiofrequency filter 101 (such as FIG. 1), and a sidewall of the high-k dielectric layer 32A may be sandwiched between the electrically conductive structure CS and the spacer structure SP1 in the horizontal direction accordingly.

As shown in FIG. 1 and FIG. 2, the first contact structure CT1 and the second contact structure CT2 may be disposed at two opposite ends of the patterned electrically conductive film 42P in the first horizontal direction D1, respectively, and the first contact structure CT1 and the second contact structure CT2 may directly contact the patterned electrically conductive film 42P. In some embodiments, the first contact structure CT1 and the second contact structure CT2 may penetrate through a part of the patterned electrically conductive film 42P in the vertical direction D3, and a bottom surface of the first contact structure CT1 and a bottom surface of the second contact structure CT2 may be lower than a top surface of the patterned electrically conductive film 42P in the vertical direction D3 accordingly, but not limited thereto. In some embodiments, the patterned electrically conductive film 42P and the electrically conductive structure CS may extend in the first horizontal direction D1, a length of the patterned electrically conductive film 42P in the first horizontal direction D1 may be greater than a length of the electrically conductive structure CS in the first horizontal direction D1, and a width W2 of the patterned electrically conductive film 42P may be greater than a width W1 of the electrically conductive structure CS. Therefore, the patterned electrically conductive film 42P may completely cover the electrically conductive structure CS in the vertical direction D3. The width W2 and the width W1 described above may be regarded as a length of the patterned electrically conductive film 42P in the second horizontal direction D2 orthogonal to the first horizontal direction D1 and a length of the electrically conductive structure CS in the second horizontal direction D2, respectively. A length L of the patterned electrically conductive film 42P located between the first contact structure CT1 and the second contact structure CT2 in the first horizontal direction D1 may be greater than the length of the patterned electrically conductive film 42P in the second horizontal direction D2 (i.e. the width W2), so that the patterned electrically conductive film 42P located between the first contact structure CT1 and the second contact structure CT2 may have sufficient length to provide the resistance required in the radiofrequency filter 101.

Figure 3:
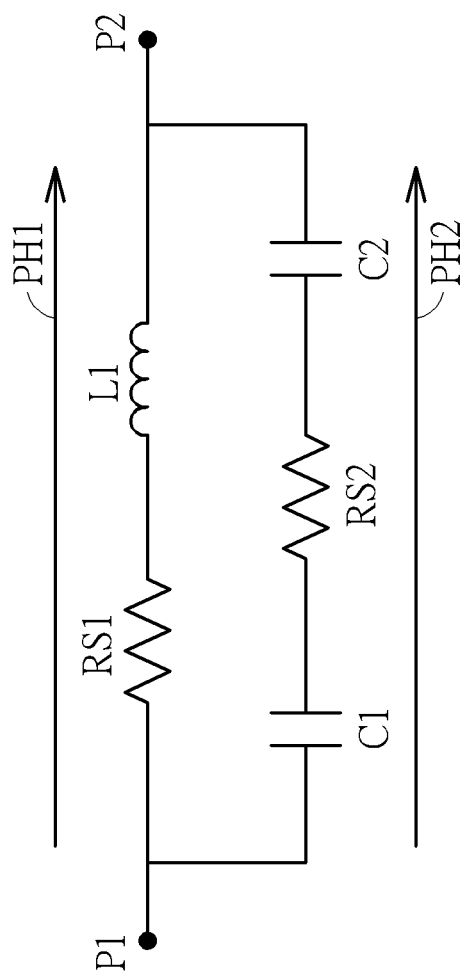
FIG. 3 is a schematic equivalent circuit diagram of the radiofrequency filter according to the first embodiment of the present invention.

Please refer to FIGS. 1-3. FIG. 3 is a schematic equivalent circuit diagram of the radiofrequency filter according to the first embodiment of the present invention. As shown in FIGS. 1-3, in some embodiments, an end P1 may be an end which the radiofrequency filter 101 is electrically connected to via the first contact structure CT1, and an end P2 may be another end which the radiofrequency filter 101 is electrically connected to via the second contact structure CT2. An electrical resistance RS1 may be substantially an electrical resistance formed by the patterned electrically conductive film 42P located between the first contact structure CT1 and the second contact structure CT2, an inductance LI may be substantially an inductance formed by the patterned electrically conductive film 42P located between the first contact structure CT1 and the second contact structure CT2, an electrically resistance RS2 may be substantially an electrically resistance of the electrically conductive structure CS, and a capacitance C1 and a capacitance C2 may respectively be a capacitance of the capacitor structure CP. In some embodiments, the first end P1 may be a signal input terminal and the second end P2 may be a signal output terminal. A first path PH1 where the signal is transmitted from the first contact structure CT1 to the second contact structure CT2 through the patterned electrically conductive film 42P may be designed as a high electrical resistance (or high electrical impedance) path, and a second path PH2 where the signal is transmitted from the first contact structure CT1 downwards through the capacitor structure CP to the electrically conductive structure CS and then transmitted upwards through the capacitor structure CP again to the second contact structure CT2 may be designed as a low electrical resistance (or low electrical impedance) path for realizing the effect of signal filtering.

For example, capacitors have relatively low impedance (or resistance) to higher frequency signals, and capacitors have relatively high impedance to lower frequency signals, while resistors have relatively low impedance to lower frequency signals, and resistors has relatively high impedance for higher frequency signals. Therefore, signals with specific lower frequency cannot pass through the first path PH1 and the second path PH2 and signals with specific higher frequency may pass through the second path PH2 for achieving the effect of high-pass filtering by increasing the electrical resistance RS1, increasing the capacitance C1 and the capacitance C2, and/or reducing the electrical resistance RS2 described above. In addition, the filtering range of the radiofrequency filter 101 may be controlled by adjusting the capacitance of the capacitor structure CP. For instance, the bottom end of the frequency range of the signal capable of passing through the radiofrequency filter 101 may be lowered by increasing the capacitance of the capacitor structure CP, and the dimension and/or the material design of the capacitor structure CP may be modified for different product needs accordingly. For example, the capacitance of the capacitor structure CP may be modified by changing the area of the patterned electrically conductive film 42P and the electrically conductive structure CS in the vertical direction D3, changing the thickness of the dielectric layer 40, and/or changing the dielectric constant of the dielectric layer 40. In some embodiments, in order to make the radiofrequency filter 101 have a significant impedance difference to signals with specific different frequencies, the patterned electrically conductive film 42P and the electrically conductive structure CS need to have a certain size area in the vertical direction D3 to form enough capacitance. For example, in order to make the radiofrequency filter 101 have a significant impedance difference between signals of 30 GHz and signals of 0.1 GHz for signal filtering, the area of the patterned electrically conductive film 42P and the electrically conductive structure CS in the vertical direction D3 may range from 20 square micrometers to 100 square micrometers, but not limited thereto.

Additionally, in some embodiments, an electrical resistance of the patterned electrically conductive film 42P located between the first contact structure CT1 and the second contact structure CT2 in the first horizontal direction D1 (such as the electrical resistance RS1 described above) may be higher than the resistance of the electrically conductive structure CS (such as the electrical resistance RS2 described above) for realizing the design of the high impedance path and the low impedance path described above, and a thickness TK2 of the patterned electrically conductive film 42P in the vertical direction D3 may be less than a thickness TK1 of the electrically conductive structure CS in the vertical direction D3 accordingly. Additionally, in some embodiments, a sheet resistance of the patterned electrically conductive film 42P may be greater than or equal to 600 ohm/sq for making the first path PH1 having sufficient electrical resistance to block signals in a specific frequency range, and the resistance (and/or the reactance) of the first path PH1 for signals in this specific frequency range may be greater than or equal to 500 ohm for blocking signals in this specific frequency range from passing through the radiofrequency filter 101 and/or reducing signals in this specific frequency range passing through the radiofrequency filter 101. In some embodiments, the radiofrequency filter 101 may be composed of the resistance, the inductance, and the capacitance illustrated in FIG. 3, and the radiofrequency filter 101 may be regarded as a passive filter accordingly. In the radiofrequency filter 101, the signal filtering effect may be achieved without disposing an inductor structure with large occupied area (such as a spiral inductor structure), the area occupied by the radiofrequency filter 101 on the substrate 10 may be relatively reduced accordingly, and that is beneficial for the design flexibility in the layout of related circuit components and/or manufacturing cost reduction. In addition, the electrically conductive structure CS may be completely disposed on the isolation structure 12A in the vertical direction D3 for reducing the influence of the substrate 10 on the radiofrequency filter 101, such as the influence of a capacitance formed between the electrically conductive structure CS and the substrate 10 on the signal filtering effect described above, but not limited thereto. In other words, the electrically conductive structure CS may not be disposed on the area except the isolation structure 12A in the vertical direction D3, and the gate dielectric layer 14A may be completely disposed on the isolation structure 12A in the vertical direction D3 without directly contacting the substrate 10.

In some embodiments, the substrate 10 may include a semiconductor substrate, such as a silicon semiconductor substrate, a silicon germanium semiconductor substrate, or a substrate made of other suitable materials, and the isolation structure 12A may include a single layer or multiple layers of insulation materials, such as silicon oxide, silicon nitride, or other suitable insulation materials. The spacer structure SP1 may include a single layer or multiple layers of insulation materials, such as silicon oxide, silicon nitride, or other suitable insulation materials. For example, the spacer structure SP1 may include a spacer SP11 and a spacer SP12 stacked with each other, and a material composition of the spacer SP11 may be different from that of the spacer SP12. In some embodiments, the radiofrequency filter 101 may further include an etching stop layer 26, a dielectric layer 28, a patterned mask layer 44P, and a dielectric layer 48. The etching stop layer 26 may be disposed on the spacer structure SP1 and the isolation structure 12A, and the dielectric layer 28 may be disposed on the etching stop layer 26. In some embodiments, the dielectric layer 40 may be further disposed on the spacer structure SP1, the etching stop layer 26, and the dielectric layer 28 in the vertical direction D3, but not limited thereto. The patterned mask layer 44P may be disposed on the patterned electrically conductive film 42P, and the dielectric layer 48 may be disposed on the dielectric layer 40 and the patterned mask layer 44P. The first contact structure CT1 and the second contact structure CT2 may penetrate through the dielectric layer 48 and the patterned mask layer 44P in the vertical direction D3. A material of the etching stop layer 26 may include silicon nitride or other suitable insulation materials, a material of the patterned mask layer 44P may include silicon nitride or other suitable mask materials, and materials of the dielectric layer 28 and the dielectric layer 48 may include silicon oxide, low dielectric constant dielectric materials (such as a dielectric material having dielectric constant lower than 2.9 or 2.7), or other suitable dielectric materials.

Figure 5:
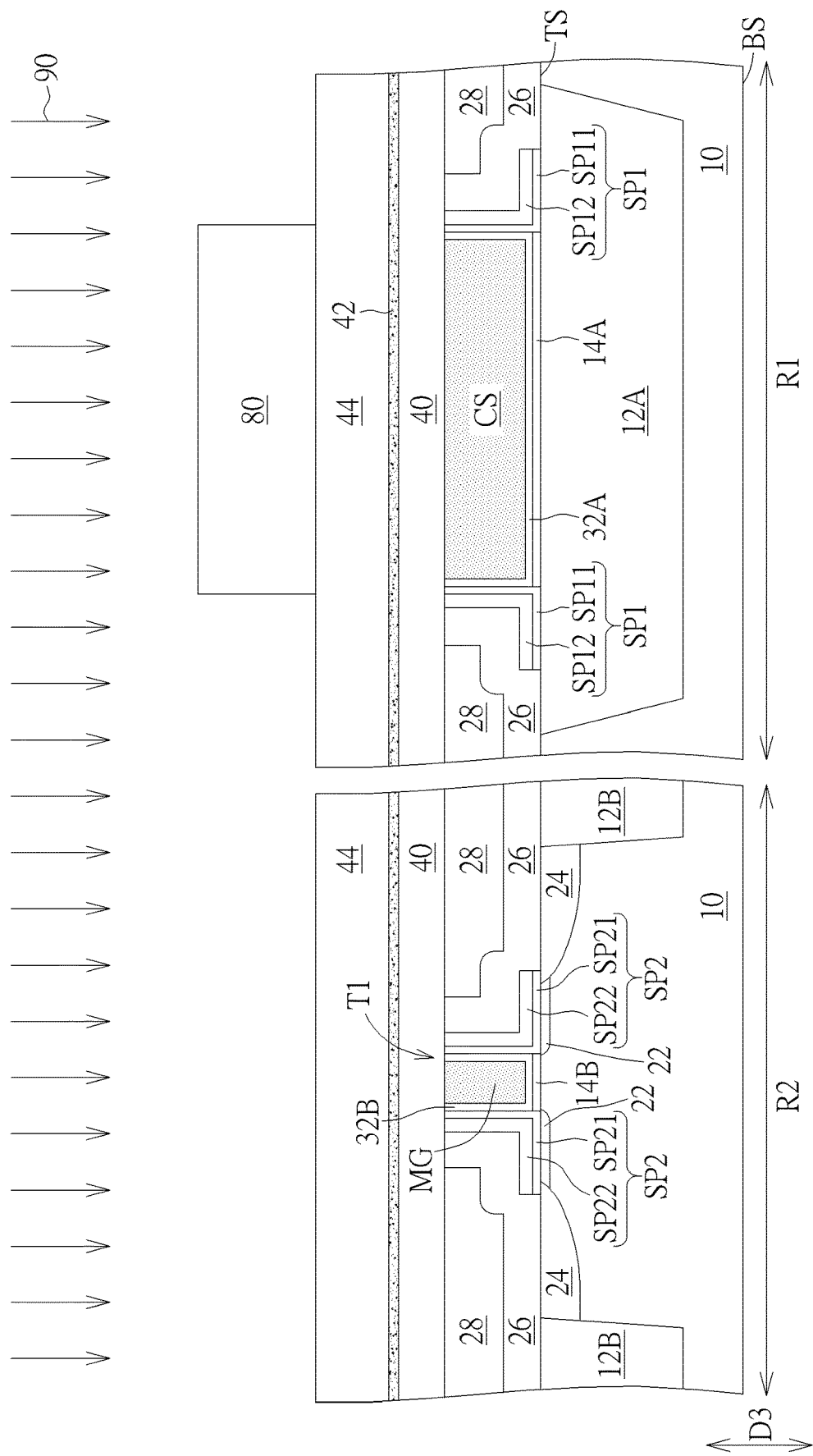
Figure 6:
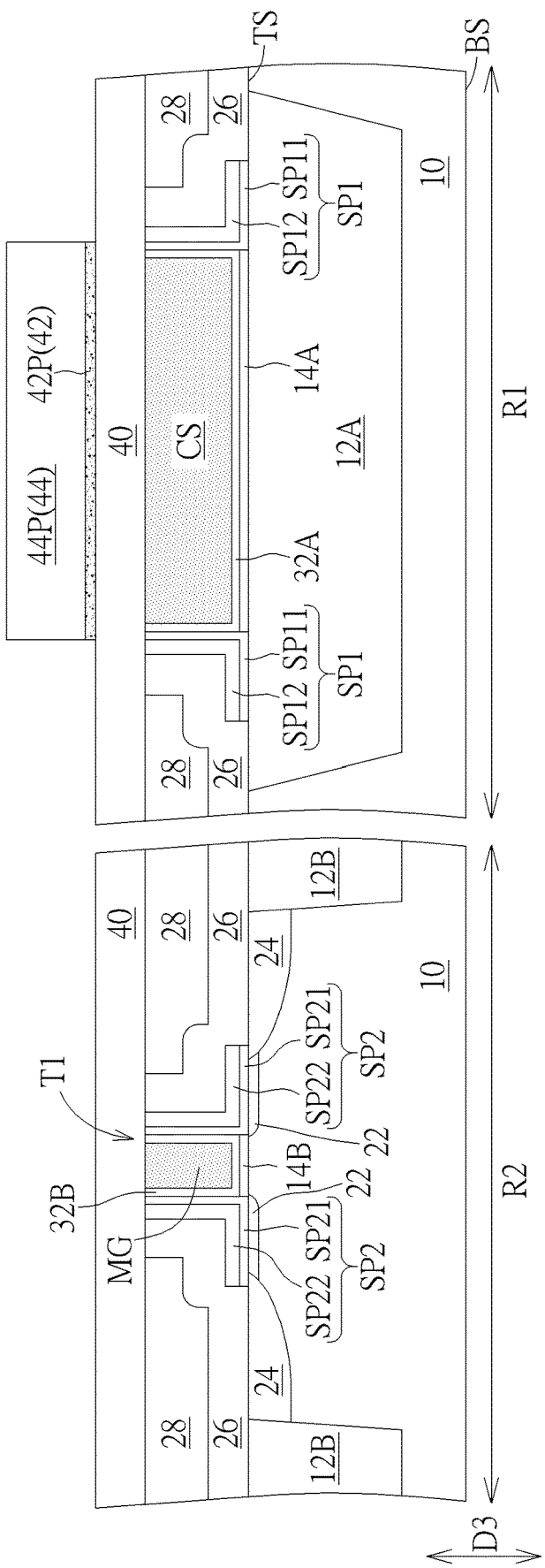
Figure 7:
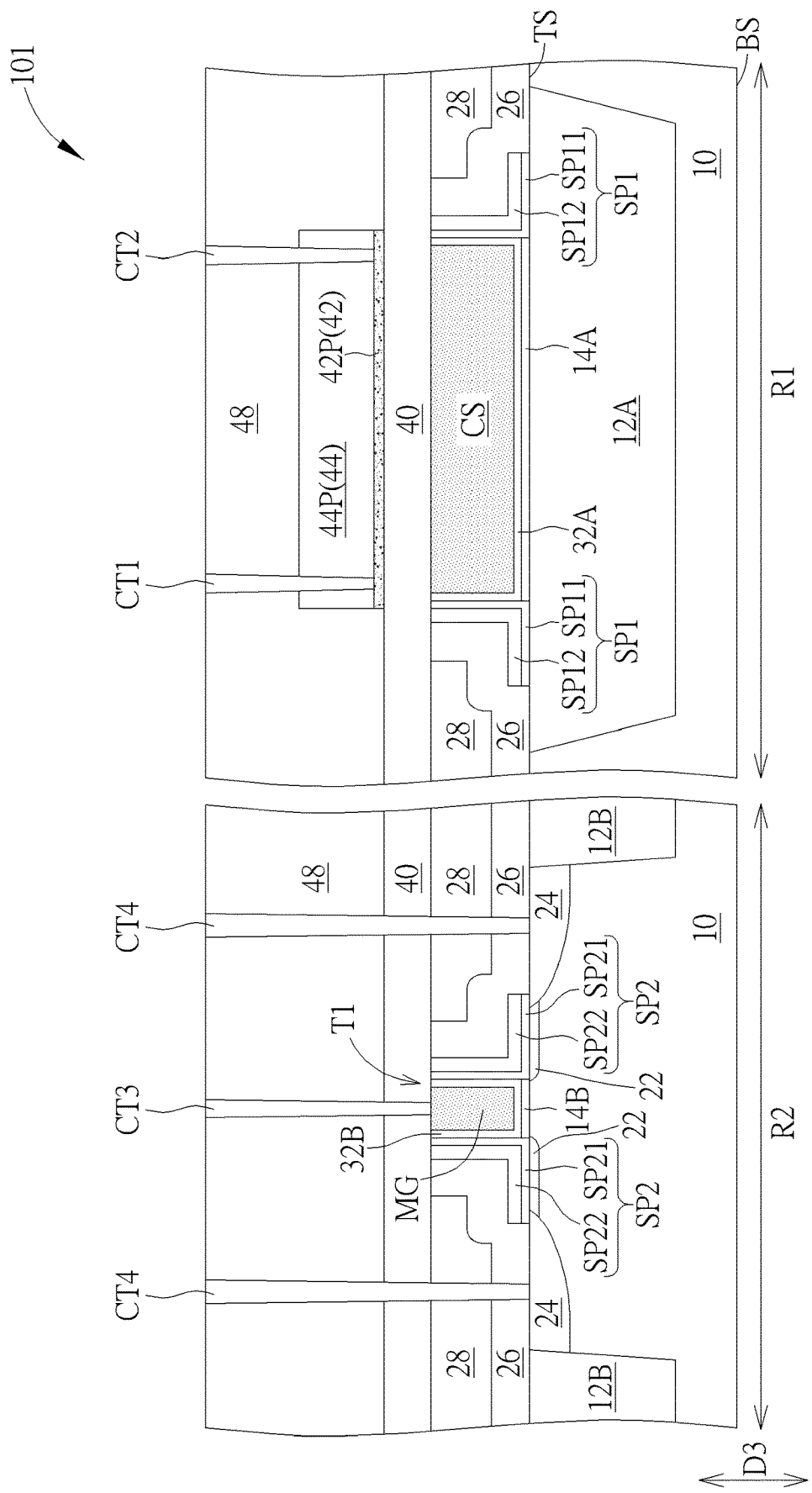

Please refer to FIGS. 4-7 and FIG. 1. FIGS. 4-7 are schematic drawings illustrating a manufacturing method of a radiofrequency filter according to the first embodiment of the present invention. As shown in FIG. 7, the manufacturing method of the radiofrequency filter in this embodiment may include the following steps.

The isolation structure 12A is formed in the substrate 10. The spacer structure SP1 is formed on the substrate 10. The electrically conductive structure CS is formed on the isolation structure 12A, and the spacer structure SP1 is located on a sidewall of the electrically conductive structure CS. The dielectric layer 40 is formed on the electrically conductive structure CS, and the patterned electrically conductive film 42P is formed on the dielectric layer 40. At least a part of the dielectric layer 40 is located between the electrically conductive structure CS and the patterned electrically conductive film 42P in the vertical direction D3. The first contact structure CT1 and the second contact structure CT2 are formed on the patterned electrically conductive film 42P. The first contact structure CT1 and the second contact structure CT2 are electrically connected with the patterned electrically conductive film 42P.

Figure 4:
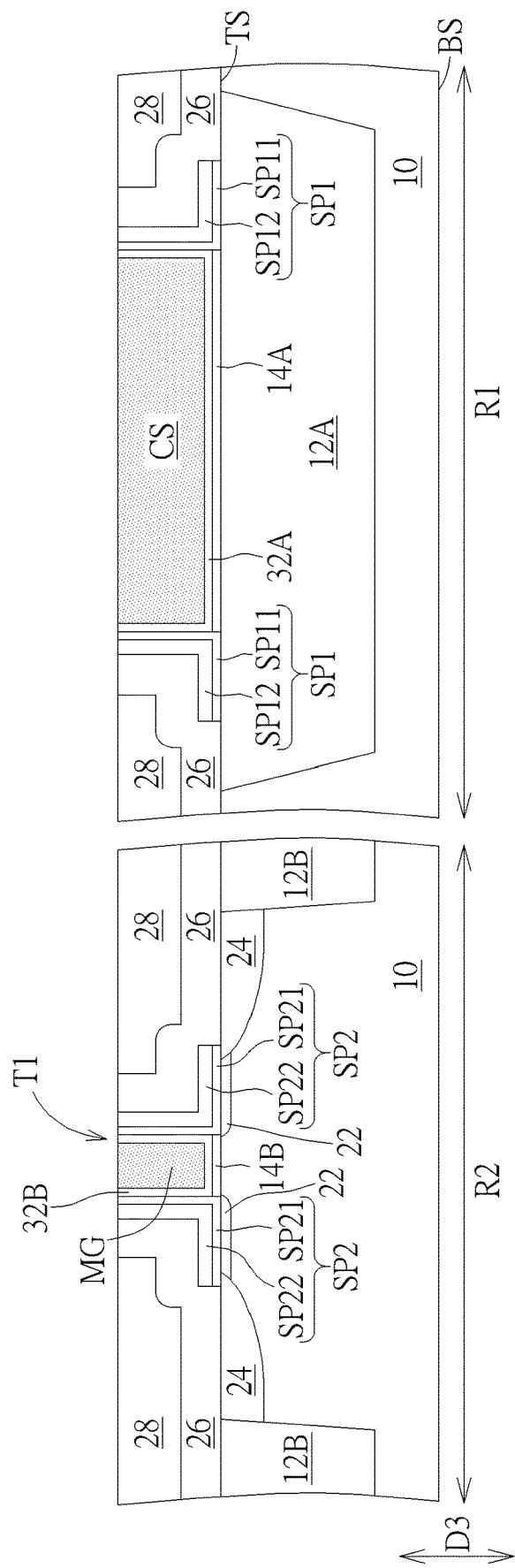

Specifically, the manufacturing method in this embodiment may include but is not limited to the following steps. As shown in FIG. 4, in some embodiments, the substrate 10 may include a first region R1 and a second region R2. The isolation structure 12A described above may be disposed in the first region R1 of the substrate 10, and an isolation structure 12B may be disposed in the second region R2 of the substrate 10 for defining active areas in the second region R2 for transistor structures. In some embodiments, the isolation structure 12A and the isolation structure 12B may be formed concurrently by the same manufacturing process and have the same material composition accordingly, but not limited thereto. The electrically conductive structure CS, the gate dielectric layer 14A, the high-k dielectric layer 32A, and the spacer structure SP1 described above may be formed above the first region R1 of the substrate 10. The manufacturing method in this embodiment may further include forming a gate dielectric layer 14B, a high-k dielectric layer 32B, a metal gate structure MG, and a spacer structure SP2 on the second region R2 of the substrate 10, and lightly doped regions 22 and source/drain doped regions 24 may be formed in the second region R2 of the substrate 10 for forming a transistor structure T1. In some embodiments, the gate dielectric layer 14A and the gate dielectric layer 14B may be formed concurrently by the same manufacturing process and have the same material composition accordingly, and the high-k dielectric layer 32A and the high-k dielectric layer 32B may be formed concurrently by the same manufacturing process and have the same material composition accordingly, but not limited thereto. Additionally, in some embodiments, the electrically conductive structure CS and the metal gate structure MG may be formed concurrently by the same manufacturing process (such as a replacement metal gate process) and have the same material composition (such as the barrier layer 34, the work function layer 36, and the metallic electrically conductive layer 38 illustrated in FIG. 1 described above), but not limited thereto. In some embodiments, the electrically conductive structure CS and the metal gate structure MG may be formed by different processes, respectively, and/or have different material compositions according to some design considerations.

The spacer structure SP2 may be formed on a sidewall of the metal gate structure MG. The spacer structure SP2 may include a single layer or multiple layers of insulation materials, such as silicon oxide, silicon nitride, or other suitable insulation materials. For example, the spacer structure SP2 may include a spacer SP21 and a spacer SP22 stacked with each other, and a material composition of the spacer SP21 may be different from that of the spacer SP22. In some embodiments, the spacer structure SP1 and the spacer structure SP2 may be formed concurrently by the same manufacturing process and have the same material composition also, but not limited thereto. In addition, the etching stop layer 26 and the dielectric layer 28 described above may be further formed above the second region R2 of the substrate 10, and the etching stop layer 26 located above the second region R2 may be formed on the spacer structure SP2, the source/drain doped regions 24, and the isolation structure 12B. In some embodiments, a dummy gate (not illustrated) surrounded by the spacer structure SP1 and a dummy gate (not illustrated) surrounded by the spacer structure SP2 may be removed for forming a trench surrounded by the spacer structure SP1 and a trench surrounded by the spacer structure SP2, respectively. A high-k dielectric material and an electrically conductive material may be formed filling the trenches, and a planarization process may be performed for removing the high-k dielectric material and the electrically conductive material located outside the trenches so as to form the high-k dielectric layer 32A, the high-k dielectric layer 32B, the metal gate structure MG, and the electrically conductive structure CS. Therefore, a top surface of the metal gate structure MG, a top surface of the spacer structure SP2, a top surface of the electrically conductive structure CS, and a top surface of the spacer structure SP1 may be substantially coplanar, but not limited thereto.

As shown in FIG. 5, after the electrically conductive structure CS and the metal gate structure MG are formed, the dielectric layer 40, an electrically conductive film 42, and a mask layer 44 may be sequentially formed. In some embodiments, the dielectric layer 40, the electrically conductive film 42, and the mask layer 44 may be globally formed above the first region R1 and the second region R2 of the substrate 10 in the vertical direction D3. Therefore, the dielectric layer 40 may be formed on the electrically conductive structure CS, the spacer structure SP1, the metal gate structure MG, the space structure SP2, the etching stop layer 26, and the dielectric layer 28 in the vertical direction D3. The electrically conductive film 42 may be formed on the dielectric layer 40 in the vertical direction D3, and the mask layer 44 may be formed on the electrically conductive film 42 in the vertical direction D3. Subsequently, a patterned mask layer 80 may be formed on the mask layer 44 located above the first region R1, and a patterning process 90 using the patterned mask layer 80 as a mask may be performed to the mask layer 44 and the electrically conductive film 42 for removing the mask layer 44 without being covered by the patterned mask layer 80 and the electrically conductive film 42 without being covered by the patterned mask layer 80. The patterned mask layer 80 may include photoresist, an anti-reflection film, or other suitable mask materials. In some embodiments, the patterned mask layer 80 may be formed corresponding to the located of the electrically conductive structure CS in the vertical direction D3, the mask layer 44 located above the second region R2 is not covered by the patterned mask layer 80, and the patterning process 90 may be used to remove a part of the mask layer 44 and a part of the electrically conductive film 42 located above the first region R1 and remove the mask layer 44 and the electrically conductive film 42 located above the second region R2 for forming the patterned mask layer 44P and the patterned electrically conductive film 42P described above.

As shown in FIG. 5 and FIG. 6, the mask layer 44 may be patterned to be the patterned mask layer 44P by the patterning process 90, the electrically conductive film 42 may be patterned to be the patterned electrically conductive film 42P by the patterning process 90, and the patterned mask layer 80 may be removed after the patterning process 90. In some embodiments, the mask layer 44 may be formed before the patterning process 90, the patterned mask layer 44P may be used as a hard mask layer when the electrically conductive film 42 is patterned by the patterning process 90, and the patterned mask layer 44P may remain on the patterned electrically conductive film 42P after the patterning process 90 for protecting the patterned electrically conductive film 42P. It is worth noting that, in the present invention, the method for forming the patterned electrically conductive film 42P may include but is not limited to the approach illustrated in FIG. 5 and FIG. 6, and the patterned electrically conductive film 42P may be formed by other approached according to some design considerations.

As shown in FIG. 7, after the patterned mask layer 44P and the patterned electrically conductive film 42P are formed, the dielectric layer 48 may be formed above the first region R1 and the second region R2. Therefore, the dielectric layer 48 may cover the dielectric layer 40, the patterned mask layer 44P, and the patterned electrically conductive film 42P located above the first region R1 in the vertical direction D3, and the dielectric layer 48 may cover the dielectric layer 40 located above the second region R2 in the vertical direction D3. Subsequently, the first contact structure CT1 and the second contact structure CT2 described above may be formed above the first region R1, and a third contact structure CT3 and fourth contact structures CT4 located corresponding to the metal gate structure MG and the source/drain doped regions 24, respectively, may be formed above the second region R2. The first contact structure CT1 and the second contact structure CT2 may be formed at two opposite ends of the patterned electrically conductive film 42P in a first horizontal direction (such as the first horizontal direction D1 illustrated in FIG. 1), respectively. The first contact structure CT1 and the second contact structure CT2 may penetrate through the patterned mask layer 44P and the dielectric layer 48 located on the patterned mask layer 44P in the vertical direction D3 for contacting and being electrically connected with the patterned electrically conductive film 42P. In some embodiments, the bottom surfaces of the first contact structure CT1 and the second contact structure CT2 may be lower than the top surface of the patterned electrically conductive film 42P in the vertical direction D3, but not limited thereto. The third contact structure CT3 may penetrate through the dielectric layer 48 and the dielectric layer 40 located above the metal gate structure MG in the vertical direction D3 for being electrically connected with the metal gate structure MG. The fourth contact structure CT4 may penetrate through the dielectric layer 48, the dielectric layer 40, the dielectric layer 28, and the etching stop layer 26 located above the source/drain doped region 24 in the vertical direction D3 for being electrically connected with the source/drain doped region 24. Each of the contact structures described above may include a low electrical resistivity material and a barrier layer, the low electrical resistivity material may include materials with relatively low resistivity, such as copper, aluminum, tungsten, and so forth, and the barrier layer may include titanium nitride, tantalum nitride, or other suitable barrier materials. In the manufacturing method in this embodiment, the manufacturing method of some components in the radiofrequency filter 101 (such as the electrically conductive structure CS) may be integrated with the manufacturing method of other devices on the substrate 10 (such as the transistor structure T1), and purposes of process simplification and/or manufacturing cost reduction may be achieved accordingly.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 8:
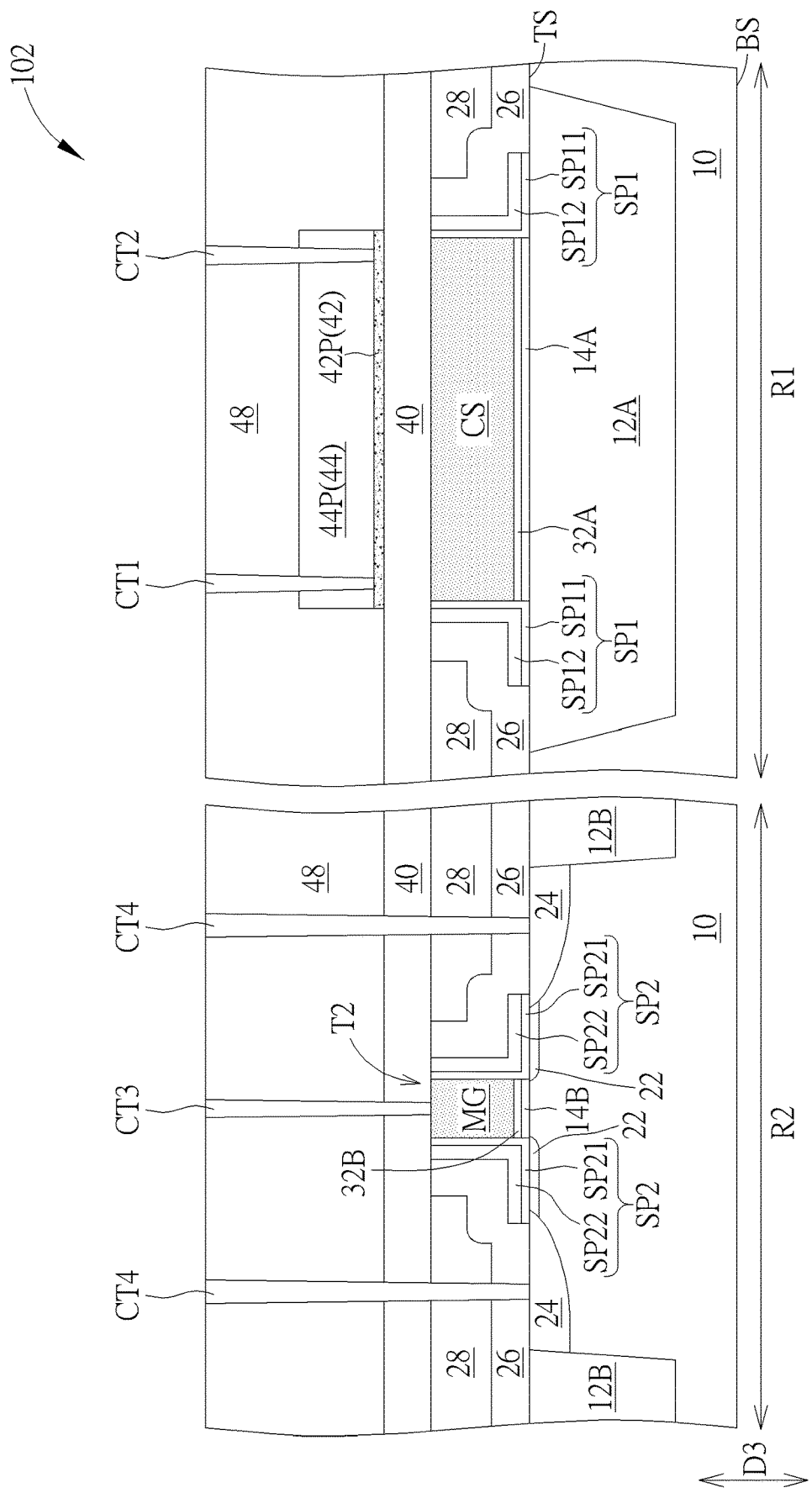
FIG. 8 is a schematic drawing illustrating a radiofrequency filter according to a second embodiment of the present invention.

Please refer to FIG. 8. FIG. 8 is a schematic drawing illustrating a radiofrequency filter 102 according to a second embodiment of the present invention. As shown in FIG. 8, in the radiofrequency filter 102, the high-k dielectric layer 32A may be completely disposed between the electrically conductive structure CS and the gate dielectric layer 14A in the vertical direction D3, and the electrically conductive structure CS may be directly connected with the spacer structure SP1 accordingly. In some embodiments, the high-k dielectric layer 32A and the high-k dielectric layer 32B of a transistor structure T2 may be formed concurrently by the same process, the electrically conductive structure CS and the metal gate structure MG of the transistor structure T2 may be formed concurrently by the same process, the high-k dielectric layer 32A and the high-k dielectric layer 32B may be formed before the step of forming the dummy gates described above, and this manufacturing method may be regarded as a high-k first replacement metal gate (RMG) process accordingly. Relatively, the manufacturing method for forming the high-k dielectric layer 32A, the high-k dielectric layer 32B, the electrically conductive structure CS, and the metal gate structure MG in the first embodiment described above may be regarded as a high-k last replacement metal gate process, but not limited thereto.

To summarize the above descriptions, according to the radiofrequency filter and the manufacturing method thereof in the present invention, the electrically conductive structure, the dielectric layer, and the patterned electrically conductive film may be disposed stacked with one another, and the first contact structure and the second contact structure are disposed on the patterned electrically conductive film for forming the low electrical resistance (or low electrical impedance) path and the high electrical resistance (or high electrical impedance) path so as to realize signal filtering without disposing a relatively large inductor structure. The area occupied by the radiofrequency filter may be relatively reduced accordingly, and that is beneficial for the design flexibility in the layout of related circuit components and/or manufacturing cost reduction relatively. Additionally, in some embodiments, the manufacturing method of some components in the radiofrequency filter (such as the electrically conductive structure) may be integrated with the manufacturing method of other devices on the substrate (such as the transistor structure), and purposes of process simplification and/or manufacturing cost reduction may be achieved accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A radiofrequency (RF) filter, comprising:
a substrate;
an isolation structure disposed in the substrate;
an electrically conductive structure disposed on the isolation structure;
a spacer structure disposed on the substrate and located on a sidewall of the electrically conductive structure;
a dielectric layer disposed on the electrically conductive structure;
a patterned electrically conductive film disposed on the dielectric layer, wherein at least a part of the dielectric layer is located between the electrically conductive structure and the patterned electrically conductive film in a vertical direction; and
a first contact structure and a second contact structure, wherein the first contact structure and the second contact structure are disposed on and electrically connected with the patterned electrically conductive film, and the electrically conductive structure is completely disposed on the isolation structure in the vertical direction.

2. The RF filter according to claim 1, wherein at least a part of the dielectric layer is sandwiched between the patterned electrically conductive film and the electrically conductive structure in the vertical direction, and the dielectric layer is directly connected with the patterned electrically conductive film and the electrically conductive structure.

3. The RF filter according to claim 2, wherein the patterned electrically conductive film, the electrically conductive structure, and the dielectric layer sandwiched between the patterned electrically conductive film and the electrically conductive structure in the vertical direction constitute a capacitor structure.

4. The RF filter according to claim 1, wherein the first contact structure and the second contact structure are disposed at two opposite ends of the patterned electrically conductive film in a first horizontal direction, respectively.

5. The RF filter according to claim 4, wherein a length of the patterned electrically conductive film located between the first contact structure and the second contact structure in the first horizontal direction is greater than a length of the patterned electrically conductive film in a second horizontal direction orthogonal to the first horizontal direction.

6. The RF filter according to claim 4, wherein an electrical resistance of the patterned electrically conductive film located between the first contact structure and the second contact structure in the first horizontal direction is higher than an electrical resistance of the electrically conductive structure.

7. The RF filter according to claim 1, wherein a thickness of the patterned electrically conductive film in the vertical direction is less than a thickness of the electrically conductive structure in the vertical direction.

8. The RF filter according to claim 1, wherein the electrically conductive structure comprises:
   a work function layer; and
   a metallic electrically conductive layer disposed on the work function layer.

9. The RF filter according to claim 1, wherein the dielectric layer is further disposed on the spacer structure in the vertical direction.

10. A manufacturing method of a radiofrequency (RF) filter, comprising:
    forming an isolation structure in a substrate;
    forming a spacer structure on the substrate;
    forming an electrically conductive structure on the isolation structure, wherein the spacer structure is located on a sidewall of the electrically conductive structure;
    forming a dielectric layer on the electrically conductive structure;
    forming a patterned electrically conductive film on the dielectric layer, wherein at least a part of the dielectric layer is located between the electrically conductive structure and the patterned electrically conductive film in a vertical direction; and
    forming a first contact structure and a second contact structure on the patterned electrically conductive film, wherein the first contact structure and the second contact structure are electrically connected with the patterned electrically conductive film,
    wherein the patterned electrically conductive film, the electrically conductive structure, and the dielectric layer located between the patterned electrically conductive film and the electrically conductive structure in the vertical direction constitute a capacitor structure.

11. The manufacturing method of the RF filter according to claim 10, wherein the electrically conductive structure is formed above a first region of the substrate, and the manufacturing method of the RF filter further comprises:
    forming a metal gate structure on a second region of the substrate, wherein the electrically conductive structure and the metal gate structure are formed concurrently by the same process.

12. The manufacturing method of the RF filter according to claim 11, wherein a material composition of the electrically conductive structure is identical to a material composition of the metal gate structure.

13. The manufacturing method of the RF filter according to claim 11, wherein the dielectric layer is further formed on the metal gate structure in the vertical direction.

14. The manufacturing method of the RF filter according to claim 11, wherein a method of forming the patterned electrically conductive film comprises:
    forming an electrically conductive film on the dielectric layer, wherein the electrically conductive film is formed above the first region and the second region of the substrate in the vertical direction; and
    performing a patterning process to the electrically conductive film, wherein the electrically conductive film located above the second region and a part of the electrically conductive film located above the first region are removed by the patterning process, and the electrically conductive film is patterned to be the patterned electrically conductive film by the patterning process.

15. The manufacturing method of the RF filter according to claim 14, wherein the method of forming the patterned electrically conductive film further comprises:
    forming a mask layer on the electrically conductive film before the patterning process, wherein the mask layer is patterned to be a patterned mask layer by the patterning process, and the first contact structure and the second contact structure penetrate through the patterned mask layer in the vertical direction.

16. The manufacturing method of the RF filter according to claim 10, wherein the first contact structure and the second contact structure are formed at two opposite ends of the patterned electrically conductive film in a first horizontal direction, respectively.

17. The manufacturing method of the RF filter according to claim 16, wherein a length of the patterned electrically conductive film located between the first contact structure and the second contact structure in the first horizontal direction is greater than a length of the patterned electrically conductive film in a second horizontal direction orthogonal to the first horizontal direction.

18. The manufacturing method of the RF filter according to claim 16, wherein an electrical resistance of the patterned electrically conductive film located between the first contact structure and the second contact structure in the first horizontal direction is higher than an electrical resistance of the electrically conductive structure.

* * * * *